United States Patent [19]

Kimura et al.

[11] Patent Number: 5,006,739

[45] Date of Patent: Apr. 9, 1991

[54] CAPACITIVE LOAD DRIVE CIRCUIT

[75] Inventors: Yuichiro Kimura; Nobuaki Kabuto; Satoru Takashimizu, all of Yokohama; Katsuhiro Masujima, Kodaira, all of Japan

[73] Assignee: Hitachi, Ltd., Tokyo, Japan

[21] Appl. No.: 567,703

[22] Filed: Aug. 15, 1990

Related U.S. Application Data

[63] Continuation of Ser. No. 206,037, Jun. 13, 1988, abandoned.

[30] Foreign Application Priority Data

Jun. 15, 1987 [JP] Japan .................... 62-146854
Sep. 30, 1987 [JP] Japan .................... 62-243705

[51] Int. Cl.⁵ .................... H03K 3/01; H03K 3/26
[52] U.S. Cl. .................... 307/270; 307/496; 307/359; 307/263; 307/246; 328/185
[58] Field of Search ............ 307/270, 246, 443, 455, 307/255, 263, 359, 595, 603; 328/183–185

[56] References Cited

U.S. PATENT DOCUMENTS

| | | | |
|---|---|---|---|
| 3,471,714 | 10/1969 | Gugliotti | 307/255 |
| 3,694,748 | 9/1972 | Hekimian | 307/255 |
| 3,751,682 | 8/1973 | Howe | 307/270 |
| 3,760,196 | 9/1973 | Nomoto et al. | 307/544 |
| 3,959,782 | 5/1976 | Dunn | 307/443 |
| 4,185,211 | 1/1980 | Kucharewski | 307/359 |
| 4,322,636 | 3/1982 | Schröder | 328/181 |
| 4,328,434 | 5/1982 | Geller | 307/359 |
| 4,578,600 | 3/1986 | Magee | 307/270 |
| 4,835,417 | 5/1989 | Kousaka et al. | 307/548 |

FOREIGN PATENT DOCUMENTS

| | | | |
|---|---|---|---|
| 0059864 | 5/1979 | Japan | 307/246 |
| 8502955 | 7/1985 | World Int. Prop. O. | 307/270 |

OTHER PUBLICATIONS

Pricer, "Combination Driver for High Cap," IBM Tech. Bulletin, vol. 27, No. 4A, Sep. 84, pp. 1974–1975.
Yamai et al., Integrated Circuits Engineering, Corona Publishing, 1979, p. 77.
Yojiro, "Linear IC Practical Circuits Manual", Radio Gijutsu Sha, Japan, 1980, p. 105.

Primary Examiner—Timothy P. Callahan
Attorney, Agent, or Firm—Antonelli, Terry, Stout & Kraus

[57] ABSTRACT

In parallel to a first current source for discharging (or charging) a capacitive load in a complementary way with respect to a voltage output circuit, a second current source for compensating a voltage change caused by leak resistance is provided. Since the voltage change of the capacitive load caused by the leak resistance is not so large, the amount of a current let flow by the second current source provided for compensating the voltage change of the capacitive load caused by the leak resistance may be made smaller than the amount of a current let flow by the first current source. By providing the second current source, therefore, it becomes possible to compensate the voltage change of the capacitive load caused by leak resistance while limiting an increase in dissipated power to a very small value.

8 Claims, 12 Drawing Sheets

CAPACITIVE LOAD DRIVE CIRCUIT

This application is a continuation of application Ser. No. 206,037, filed on Jun. 13, 1988, now abandoned.

BACKGROUND OF THE INVENTION

The present invention relates to a capacitive load drive circuit such as a liquid crystal drive circuit, and in particular to a low power consumption, fast response capacitive load drive circuit suitable for driving a leaky capacitive load.

As a conventional circuit for driving a capacitive load, a circuit as shown in FIG. 1 is known. In FIG. 1, C denotes a capacitive load, numeral 1 a voltage output circuit for charging a capacitive load, numeral 2 a current source, numeral 3 a switch, numeral 4 control means of the switch 3, $V_{in}$ a signal input terminal, R a leak resistance, and $V_{CC}$ and $V_{BB}$ power sources.

A signal inputted through the signal input terminal $V_{in}$ is applied to the voltage output circuit 1. The output voltage of the voltage output circuit 1 changes in accordance with a change in the input signal thereof. For brevity of explanation, it is now assumed that the output voltage of the voltage output circuit illustrated in FIG. 1 is equal to the input voltage thereof. The voltage output circuit 1 of FIG. 1 has only one function of injection among two functions of charge injection and charge extraction with respect to the capacitive load C. For performing both the charge injection and the charge extraction with respect to the capacitive load C, therefore, the voltage output circuit 1 is used in combination with the current source 2 for extracting the charge. When the input signal voltage changes to a higher value under the condition that the output voltage of the voltage output circuit 1 varies in accordance with the applied input signal, the voltage across the capacitive load C is lower than the input voltage of the voltage output circuit 1. Therefore, the capacitive load C is charged until the voltage across the capacitive load C becomes equal to the input voltage of the voltage output circuit 1. On the other hand, when the input signal voltage of the voltage output circuit 1 changes to a lower value, contrary to the above described case, the voltage across the capacitive load C is higher than the input voltage of the voltage output circuit. For making the output voltage of the voltage output circuit 1 equal to the input voltage of the voltage output circuit 1, therefore, the charge of the capacitive load C must be discharged.

On the other hand, the voltage output circuit 1 is provided to charge the capacitive load C as described before, and hence the voltage output circuit is not capable of discharging the charge of the capacitive load C. When the capacitive load C is to be discharged, the switch 3 illustrated in FIG. 1 is closed to connect the capacitive load C to the current source 2, the charge of the capacitive load C being discharged. After the output voltage of the voltage output circuit 1, i.e., the voltage across the capacitive load C becomes equal to the input voltage of the voltage output circuit 1 and hence the discharge of the capacitive load is stopped, the switch 3 is opened again. The opening and closing operation of the switch 3 is controlled by the control means 4. Under the ideal condition, the voltage across the capacitive load C after the switch 3 is opened is kept at constant voltage so long as the output of the voltage output circuit 1 does not change. However, an actual capacitive load is accompanied by leak resistance as represented by R in FIG. 1, for example. In case high-precision voltage is demanded as voltage held by the capacitive load C, therefore, the voltage held by the capacitive load C is changed by the leak resistance R. This change poses a problem. For compensating this voltage change, it is necessary to always close the switch 3 to connect the capacitive load C to the current source 2 and thereby discharge the charge flowing in from the power supply $V_{CC}$ through the leak resistance R.

On the other hand, the current flowing into the current source is set at a large value so that the input signal voltage to the voltage output circuit 1 may be made equal to the voltage across the capacitive load C in a predetermined time even in case where the change of the output voltage of the voltage output circuit 1, i.e., the change of the voltage across the capacitive load C becomes the maximum. Since in general the leak resistance R has a large value and the voltage change of the capacitive load C caused by the leak resistance R is not so large, its compensating current may have a small value. By closing the switch 3 in the circuit of FIG. 1, therefore, a larger current than that required for compensating the voltage change of the load capacitance C caused by the leak resistance R flows, resulting in a problem of increased power dissipation. When a method of thus turning on and off one current source is used, it is difficult to make the leak current compensation compatible with the reduction in power dissipation. As a circuit of the prior art relating to this, a circuit for changing over a single current source between two values of currents is known as described in "Shuseki Kairo Kogaku (2) (Integrated Circuit Engineering (2))" written by Hisayoshi Yanai et al., published by Corona Publishing Co., Ltd., 1979, P. 97. However, this method has a problem that an element used as the current source cannot be designed in an optimum way.

SUMMARY OF THE INVENTION

The present invention aims at eliminating the above described difficulty. An object of the present invention is to provide a quick-response capacitive load drive circuit satisfying requirements of both compensation of leak current and reduction of power dissipation.

In accordance with a feature of the present invention, a second current source 5 for compensating the voltage change caused by the leak resistance R is disposed in parallel to a first current source 2 as shown in FIG. 2. Since the voltage change of the capacitive load C caused by the leak resistance R is not so large, the value of the current permitted to flow by the second current source 5, which is provided for compensating the voltage change of the capacitive load C caused by the leak resistance R, may be smaller than the value of the current permitted to flow by the first current source 2. It is thus possible to compensate the voltage change of the capacitive load C caused by the leak resistance R while restraining power dissipation to a small value by providing the second current source 5. For example, power dissipated in the circuit of FIG. 1 will now be derived. Assuming that:

power supply voltage $V_{CC} = 15$ V, $V_{BB} = 0$ V (GND);

time taken for the output voltage to be settled = 10 $\mu$sec; capacitive load = 100 PF; and dynamic range of output voltage = 10 $V_{PP}$,
the current value I of the current source 2 becomes $$I = \frac{CV}{t} = \frac{100 \; PF \times 10 \; V_{PP}}{10 \; \mu sec} = 100 \; \mu A.$$

Accordingly, the power dissipated by always letting flow this current becomes $$15 \; V \times 100 \; \mu A = 1.5 \; mW.$$

The power dissipated in the circuit of FIG. 2 will now be described. Assuming that:
the current value of the second current source = 10 $\mu A$; and
time duration during which voltage is held by the capacitive load = 52 $\mu sec$,
the power dissipated in the circuit of FIG. 2 is calculated as $$15 \; V \times \left( \frac{10 \; \mu sec}{10 \; \mu sec + 52 \; \mu sec} \times 110 \; \mu A + \frac{52 \; \mu sec}{10 \; \mu sec + 52 \; \mu sec} \times 10 \; \mu A \right) = 0.392 \; mW.$$

This value is approximately ¼ the power dissipated in the circuit of FIG. 1.

A circuit shown in FIG. 3 will now be described. The circuit of FIG. 3 differs from the circuit shown in FIG. 2 in that control means 40 is used instead of the control means 4. The circuit of FIG. 2 is so configured that the control means 4 controls the operation of the switch 3 independently of the input signal to the voltage output circuit 1, whereas the circuit of FIG. 3 is so configured that the opening and closing operation of the switch 3 is automatically controlled depending upon the relationship between the input signal voltage to the voltage output circuit 1 and its output signal voltage. Thereby, the operation of the switch 3 is so controlled that the switch 3 may be closed, for example, when the input signal voltage to the voltage output circuit 1 is changed and it is found that the difference between the input signal voltage and the output signal voltage of the voltage output circuit 1, i.e., the voltage across the capacitive load C assumes a value not lower than a predetermined value. And the operation of the switch 3 is so controlled that the switch 3 may be opened when it is thereafter found that the difference between the input signal voltage to the voltage output circuit 1 and the output signal voltage of the voltage output circuit 1, i.e., the voltage across the capacitive load C assumes a value not higher than the predetermined value. In case the input signal voltage to the voltage output circuit 1 changes to a higher value in the above described operation, the capacitive load C is charged by the voltage output circuit 1. In case, on the contrary, the voltage obtained across the capacitive load C immediately before the input signal voltage to the voltage output circuit 1 changes is higher than the input signal voltage after the change, the charge of the capacitive load C is first discharged by the first current source 2 and the second current source 5 in accordance with the above described operation, and discharged by the second current source after the difference between the input signal voltage to the voltage output circuit 1 and the voltage across the capacitive load C has assumed a value not higher than the predetermined value. Since the second current source 5 is directly connected to the capacitive load C, the second current source 5 functions to compensate a change in the voltage held by the capacitive load C due to the leak resistance R after the voltage across the capacitive load C has become equal to the input signal voltage to the voltage output circuit 1. The operation heretofore described is illustrated in FIG. 4.

By using the circuit of FIG. 3 heretofore described, it becomes possible to automatically control the opening and closing operation of the switch 3 and concurrently therewith reduce the dissipated power as compared with the circuit of the prior art in the same way as FIG. 2.

DESCRIPTION OF THE PREFERRED EMBODIMENTS

Figure 1:
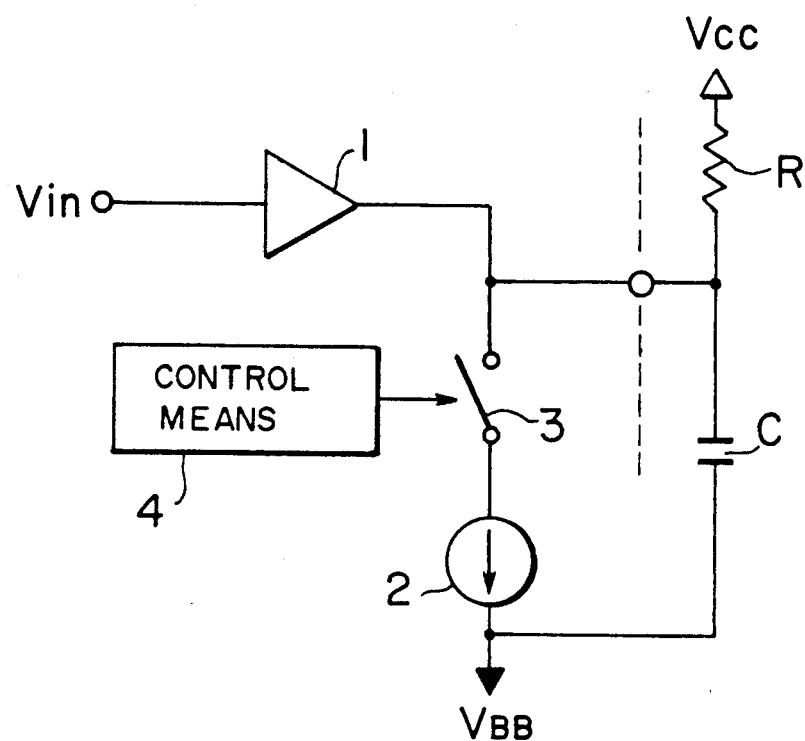
FIG. 1 shows a circuit of the prior art for driving a capacitive load.
Figure 2:
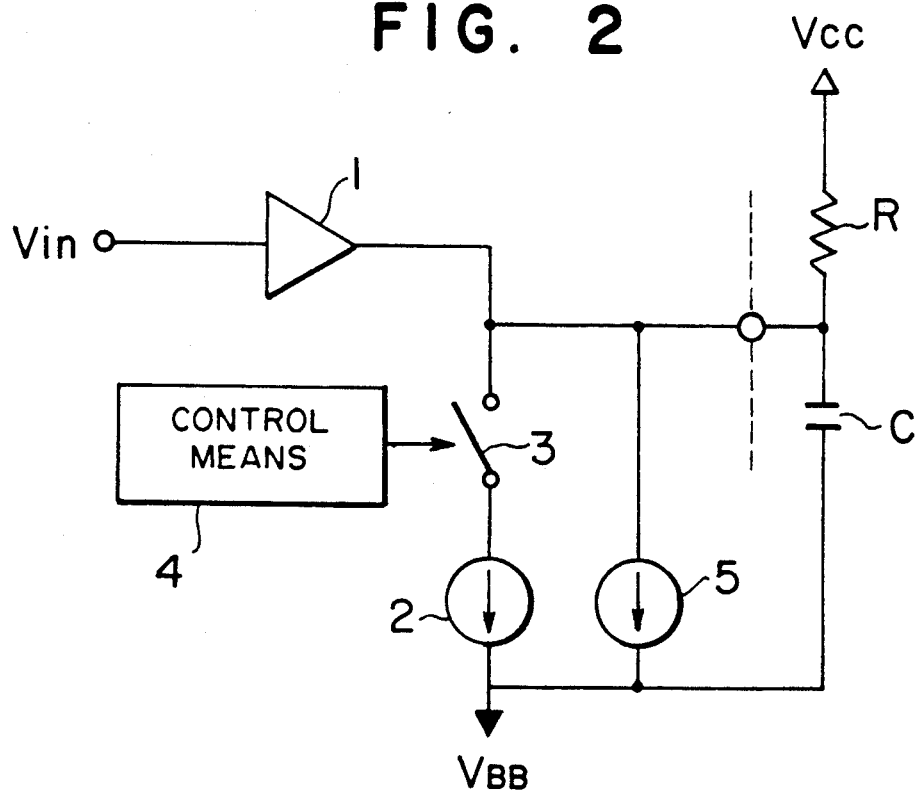
FIG. 2 shows the configuration of a capacitive load drive circuit according to the present invention.
Figure 3:
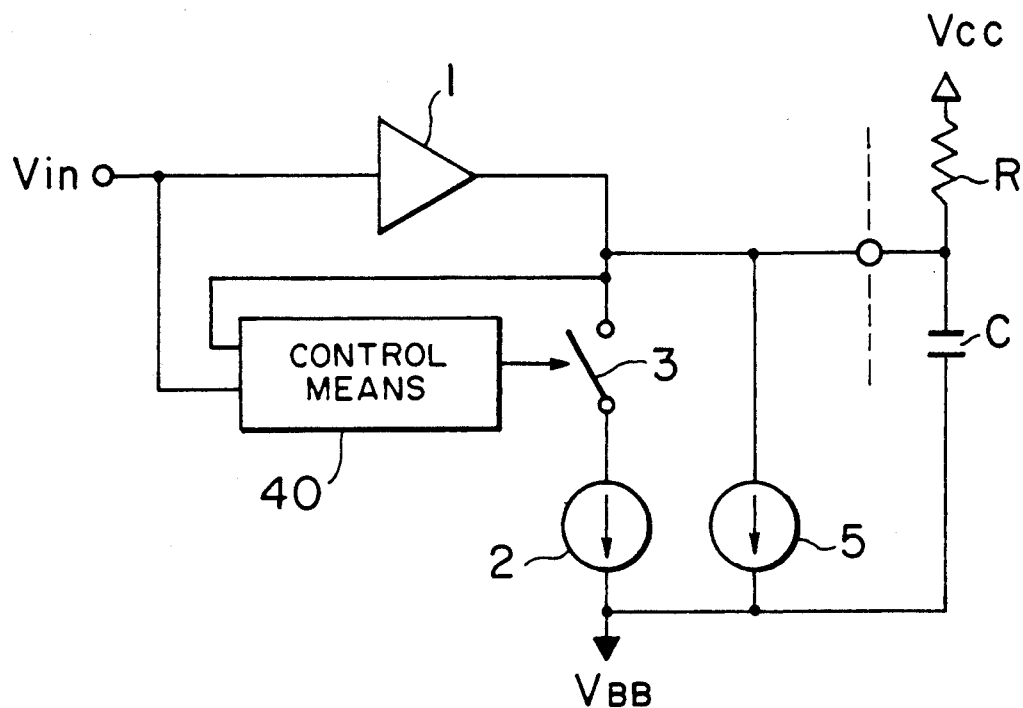
FIG. 3 shows different configuration of a capacitive load drive circuit according to the present invention.
Figure 4:
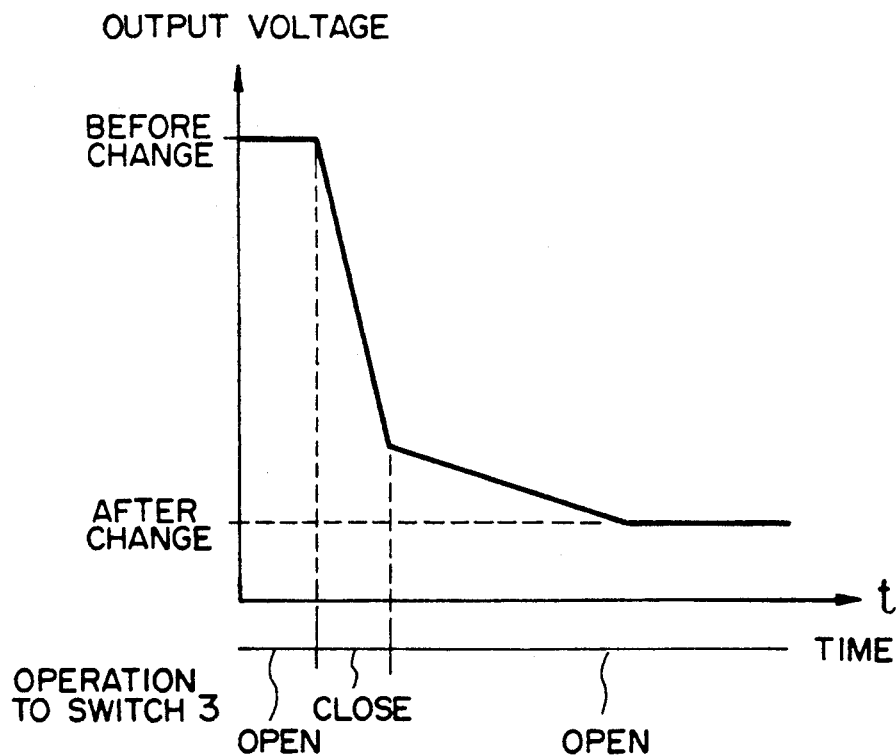
FIG. 4 shows the operation of the circuit illustrated in FIG. 3.

Embodiments of the capacitive load drive circuit having the configuration shown in FIG. 2 are shown in FIGS. 5 to 10. And embodiments of the capacitive load drive circuit having the configuration illustrated in FIG. 3 are shown in FIGS. 11 to 16.

Figure 5:
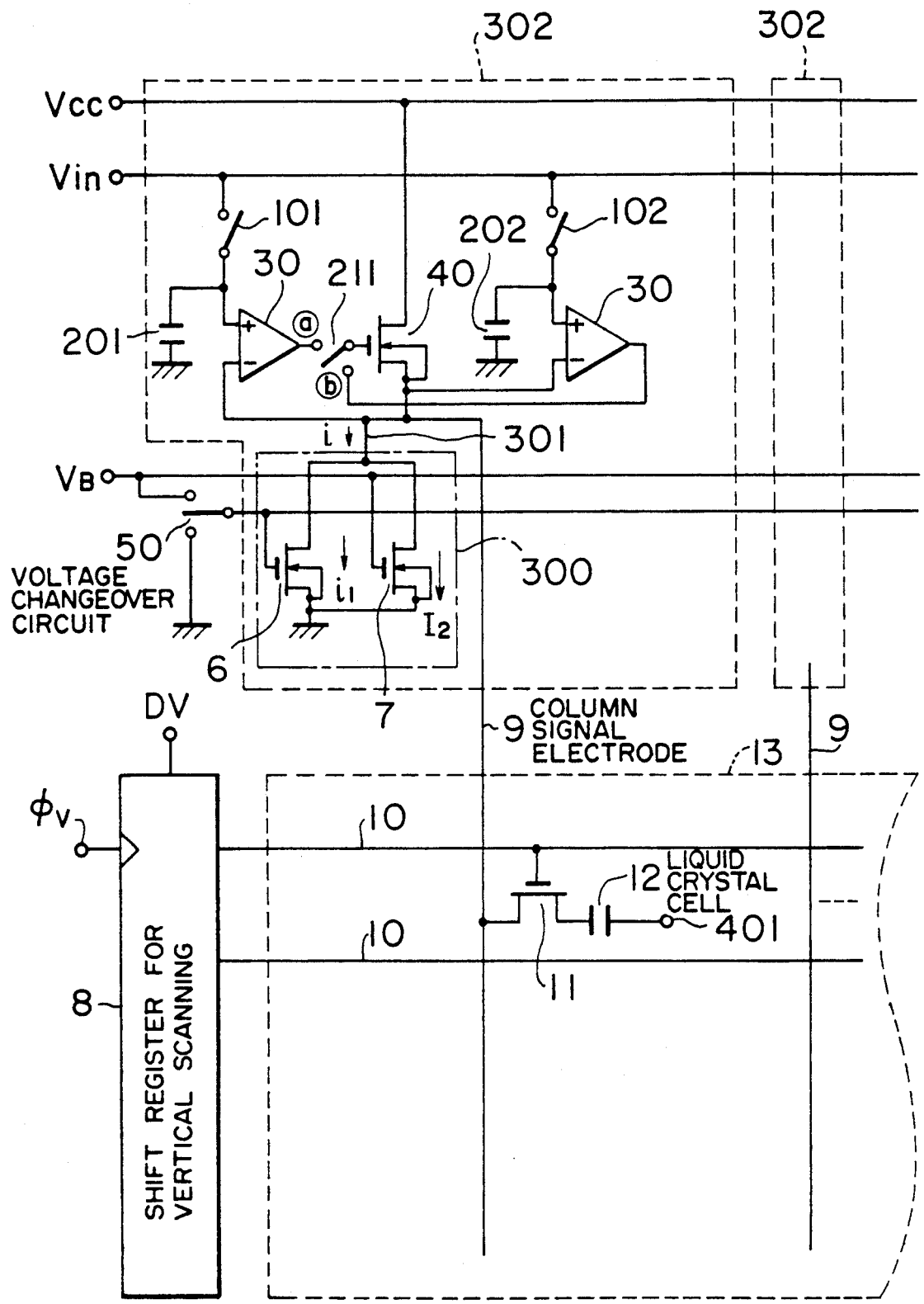
FIG. 5 shows a first embodiment of a capacitive load drive circuit according to the present invention.
Figure 6:
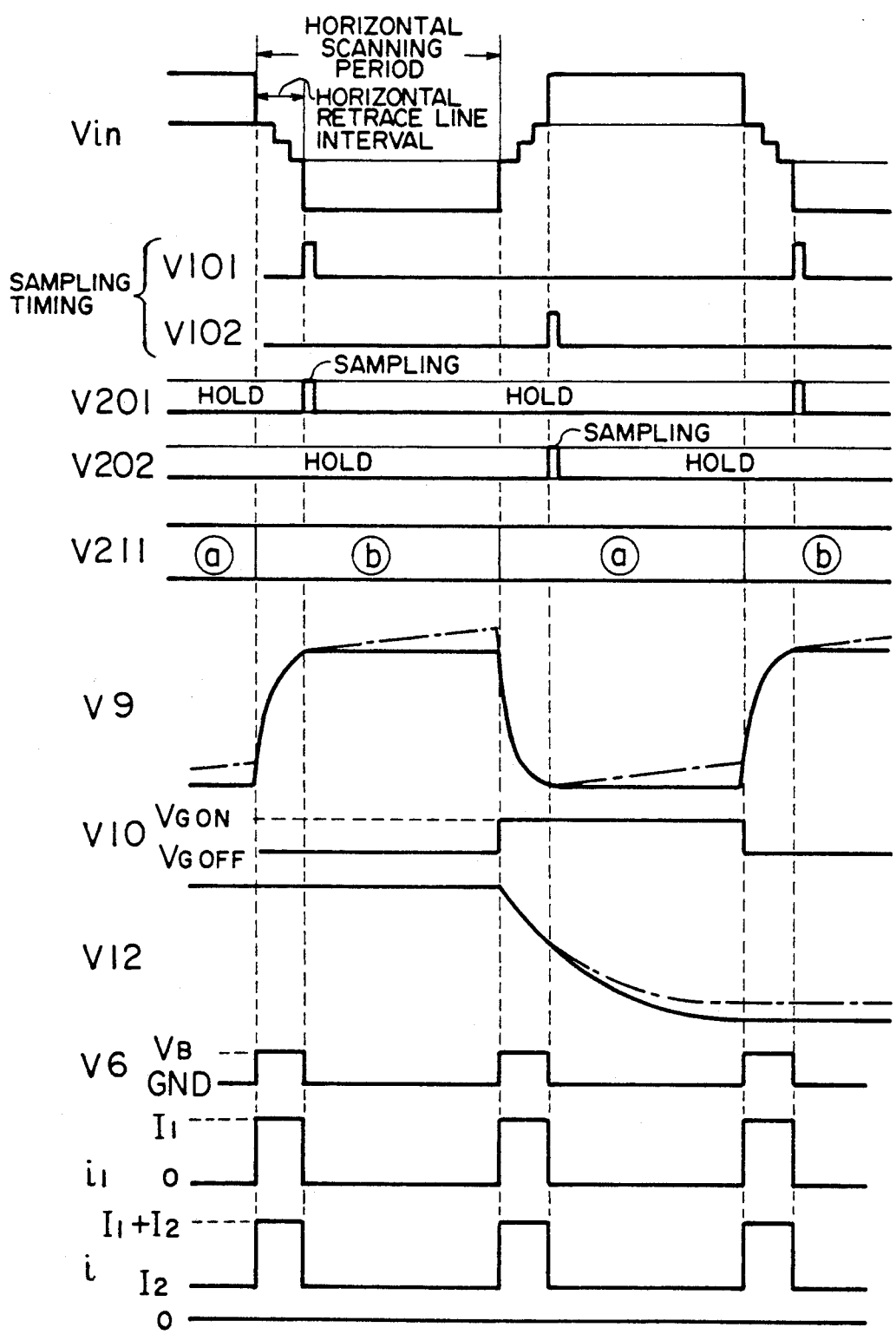
FIG. 6 shows operation waveforms of the embodiment illustrated in FIG. 5.

Embodiments of the present invention will hereafter be described by referring to drawings. FIG. 5 is a configuration diagram showing a part of a liquid crystal display apparatus using a bias current circuit according to the present invention. FIG. 6 exemplifies operation waveforms of the circuit illustrated in FIG. 5. In FIGS. 5 and 6, $V_{CC}$ denotes a power supply terminal, $V_{in}$ a signal input terminal, 101 and 102 analog switches comprising MOS transistors (or MOSFETs), for example, 201 and 202 hold capacitance, 30 a differential amplifier which corresponds to a voltage output circuit 1 in FIGS. 1 to 3, 40 an n-channel MOS transistor (or NMOSFET) used as a source follower, 50 a voltage changeover circuit for changing over between voltage $V_B$ and the GND level voltage comprising a MOS transistor, for example, 6 and 7 n-channel MOS transistors designed to constitute a bias current circuit of the present invention and let flow a predetermined current upon application of voltage $V_B$ to the gate, 8 a shift register for vertical scanning, 9 a column signal electrode, 10 a row scanning electrode, 11 a MOS transistor, 12 a liquid crystal cell, 13 a liquid crystal panel of active matrix scheme, 211 a circuit changeover switch, 401 an opposite electrode of the liquid crystal cell 12, 300 a portion showing a bias current circuit of the present invention, 301 a bias current supply terminal, 302 a drive circuit for the column signal electrode 9, V101 and V102 operation timing of the analog switches 101 and 102, V201 and V202 operation timing of sample-and-hold circuits respectively comprising the analog switch 101 and the hold capacitance 201 and the analog switch 102 and the hold capacitance 202, V211 changeover timing of the switch 211 for connecting the gate of the n-channel MOS transistor 40 to a position ⓐ or a position ⓑ, V9 voltage of the column signal electrode 9, V10 voltage of the row scanning electrode 10, V12 voltage of the liquid crystal cell 12, V6 gate voltage of the MOS transistor 6, $i_1$ a current of the MOS transistor 6, and i a current of the current supply terminal 301. As described above, FIG. 5 shows only a portion of the liquid crystal panel 13 and a liquid crystal display apparatus. As many drive circuits 302 of the column signal electrodes 9 as the column signal electrodes 9 of the liquid crystal panel 13 are provided to constitute a liquid crystal display apparatus as a whole. Further in the following description, column signal electrodes of the liquid crystal panel are driven. So long as the load is capacitive, however, a similar effect is obtained for loads other than the column signal electrodes as well.

In FIG. 5, the analog switch 101 (or 102) forms a sample-and-hold circuit in conjunction with the hold capacitance 201 (or 202). Each sample-and-hold circuit samples the input signal $V_{in}$ every other horizontal scanning period. The signal voltage corresponding to a column signal electrode 9 driven by each sample-and-hold circuit is held by the hold capacitance 201 (or 202). The signal voltage thus held is applied to the column signal electrode 9 via the high input impedance differential amplifier 30, the n-channel MOS transistor 40, and a voltage follower comprising the MOS transistors 6 and 7.

A clock pulse $\phi_V$ synchronized to the horizontal synchronization signal and a vertical scanning start signal $D_V$ obtained by delaying the vertical synchronization signal are applied to the vertical scanning shift register 8. The output of the vertical scanning shift register 8 turns on the MOS transistor 11, whose gate is connected to the row scanning electrode 10 corresponding to a horizontal scanning line of television, to supply a signal applied to the column signal electrode 9 to the liquid crystal cell 12, a picture being thus displayed. Opposite electrodes 401 of all liquid crystal cells 12 are connected in common and supplied with nearly middle potential of the input signal voltage $V_{in}$ in order to AC-drive the liquid crystal. In order to ensure the light transmittivity of the liquid crystal panel 13, the occupied area of the opaque MOS transistor 11 must be made as small as possible. Accordingly, the on-current of the MOS transistor 11 becomes small. This indicates that the time during which the signal voltage is written into the liquid crystal cell 12, which is load capacitance, via the column signal electrode 9 must be made as long as possible. Therefore, the output settling time of the circuit 302 for driving the column signal electrode 9 must be made as short as possible, and the output voltage must be kept stable.

In the embodiment of FIG. 5, the bias current i is supplied to the n-channel MOS transistor 40 used as the source follower, the column signal electrode 9 being thus driven. This bias current i is supplied by the n-channel MOS transistors 6 and 7 functioning as a current source. The fall time of the voltage applied to the column signal electrode 9 which is a capacitive load depends upon the sum $(I_1+I_2)$ obtained by adding a bias current $I_1$ of the n-channel MOS transistor 6 for extracting a current from the column signal electrode 9 and a bias current $I_2$ of the transistor 7. The currents $I_1$ and $I_2$ depend upon the channel width and the channel length of the n-channel MOS transistors 6 and 7, respectively. The channel width and the channel length of the n-channel MOS transistors 6 and 7 are designed in an optimum way so that the transistors 6 and 7 may let flow $I_1$ and $I_2$ respectively upon application of predetermined voltage $V_B$ to the gates thereof. As described before, the output settling time is desired to be short in liquid crystal display apparatuses. Therefore, the output settling time is made short by applying the voltage $V_B$ to the gate of the n-channel MOS transistor 6 to turn on the n-channel MOS transistor 6 as well and letting flow a large bias current $I_1+I_2$ upon a change of output voltage. For the remaining period lasting until the next picture signal is outputted, the voltage applied to the gate of the n-channel MOS transistor 6 is changed to the GND level by the voltage changeover circuit 50 to turn the n-channel MOS transistor 6 into the cutoff state, resulting in the relation $i_1=0$. Therefore, the bias current flowing through the n-channel MOS transistor 40 for source follower becomes $i=I_2$. If there is some leak for the power supply voltage $V_{CC}$, the voltage of the column signal electrode 9, which is a capacitive load, becomes as represented by a broken line of $V_9$, for example, in case the bias current i during this period is represented as $i=0$. Immediately before the next signal voltage is written into the column signal electrode 9, therefore, the voltage of the column signal electrode 9 differs from the initially written voltage (i.e., the voltage held by the hold capacitance 201 (or 202)) by an amount of outflow caused by the leak. Since the voltage written into the liquid crystal cell is voltage obtained immediately before the MOS transistor 11 turns off, the voltage of the liquid crystal cell 12 differs from the hold voltage of the hold capacitance 201 (or 202), the quality of the displayed picture being deteriorated.

In accordance with the present invention, however, a small amount of bias current $i=I_2$ is always let flow during this interval. It is thus possible to prevent the voltage change of the column signal electrode 9 caused by a leak of a smaller current than $I_2$. Accordingly, the quality of the displayed picture can be kept from being deteriorated. Since the bias current $I_2$ can be represented as $I_2 << I_1+I_2$, the increase in dissipated power can also be made small as compared with the case where the bias current of $I_1+I_2$ continues to be let flow by using a single MOS transistor. Further, the method of changing over the gate voltage of a single MOS transistor to change the bias current had demerits that the relative irregularities in bias current value could not be made small and the dynamic range could not be made large. However, the present invention makes possible a large current changeover ratio and a large dynamic range. In addition, the present invention brings about large effects that the output settling time can be shortened and the dissipated power can be reduced despite the fact that the signal voltage largely changes because the liquid crystal cell 12 is driven by an AC current.

In the embodiment of FIG. 5, the gate voltage for turning on the transistor 6 is set at the same voltage as the gate voltage of the transistor 7. However, these voltage values for turning on the transistors need not necessarily be identical.

Figure 7:
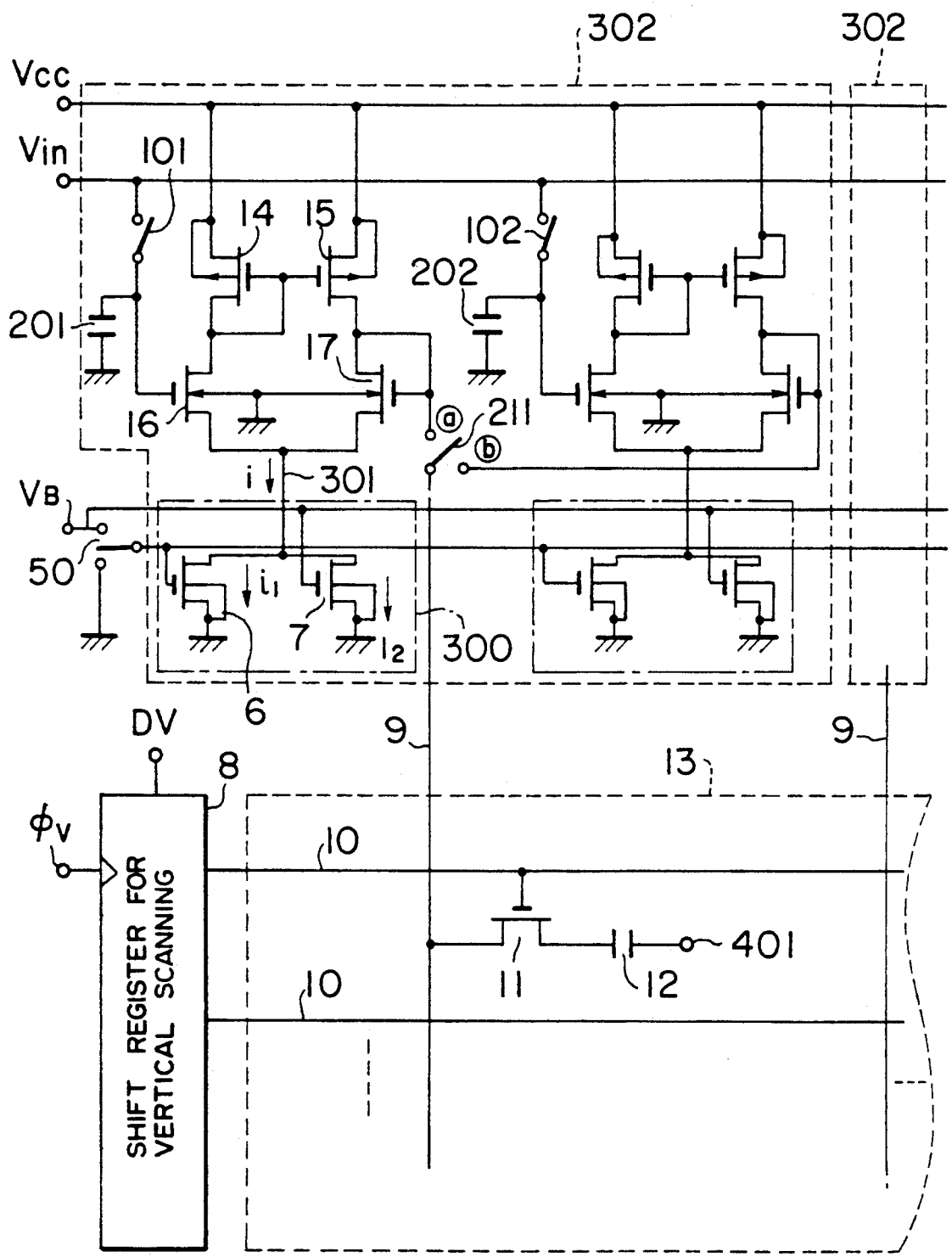
FIG. 7 shows a second embodiment of a capacitive load drive circuit according to the present invention.
Figure 8:
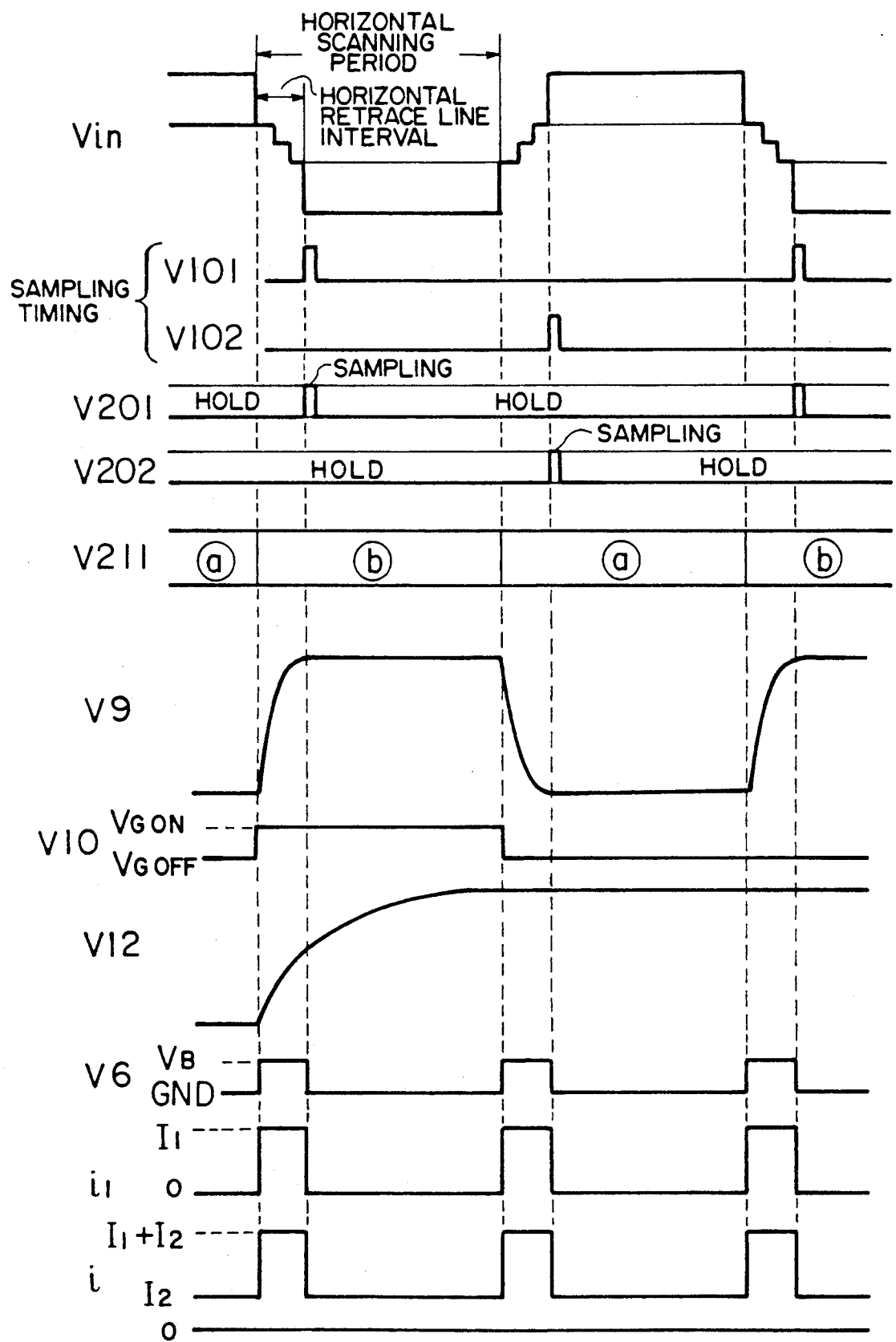
FIG. 8 shows operation waveforms of the embodiment illustrated in FIG. 7.

Another embodiment of the present invention is shown in FIG. 7, and operation waveforms of the embodiment illustrated in FIG. 7 are exemplified in FIG. 8. The embodiment of FIG. 7 differs from that of FIG. 5 in that the n-channel MOS transistor 40 for source follower is omitted and the differential amplifier 30 is used for the output circuit as it is. FIG. 7 shows the concrete configuration of a differential amplifier comprising the MOS transistors 6, 7 and 14 to 17. This differential amplifier is a capacitive load drive circuit functioning as a voltage follower by itself. The signal voltage sampled by the sample-and-hold circuit comprising the analog switch 101 (or 102) and the hold capacitance 201 (or 202) is applied to the differential amplifier.

In general, the gain of a differential amplifier becomes larger as the bias current becomes smaller. For reducing the difference (so-called offest voltage) between the output voltage applied to the column signal electrode 9 directly driven by the differential amplifier and the voltage held in the hold capacitance 201 (or 202), therefore, it is desirable to reduce the bias current and increase the gain. On the other hand, the column signal electrode 9 driven by the differential amplifier is a capacitive load. When the voltage of the column signal electrode 9 changes from a large value to a small value in the embodiment of FIG. 7, therefore, the change time depends upon the value of the bias current i of the differential amplifier extracting the charge. (Since the capacitive load is charged from the power supply $V_{CC}$ in the rising operation, the rise time is shorter than the fall time.) That is to say, reducing the bias current results in an increased gain and a reduced offset voltage. In this case, however, the output settling time is prolonged, and hence the output voltage cannot reach a predetermined value within a predetermined time. In order for the output voltage to reach the predetermined value within the predetermined time, a large bias current must be let flow. However, this results in a reduced gain and increased offset voltage.

In order to shorten the settling time as represented by V9 of FIG. 8, therefore, a large bias current of $I_1+I_2$ (where $I_1 >> I_2$) is let flow through the differential amplifier during a fixed interval such as a horizontal retrace line interval, the column signal electrode 9 being thus driven. As a result, the voltage of the column signal electrode 9 sufficiently approaches the input voltage of the differential amplifier during the horizontal retrace line interval. After the end of the horizontal retrace line interval, the voltage applied to the gate of the n-channel MOS transistor 6 is changed to the GND level to change the n-channel MOS transistor 6 into the cutoff state, resulting in the relation $i_1 = 0$. The bias current of the differential amplifier thus becomes small as represented by $i = I_2$. Hence it is possible to increase the gain and further reduce the offset voltage. Therefore, the output settling time can be shortened and the offset voltage can be reduced. Concurrently therewith, the power dissipation can be advantageously reduced.

Figure 9:
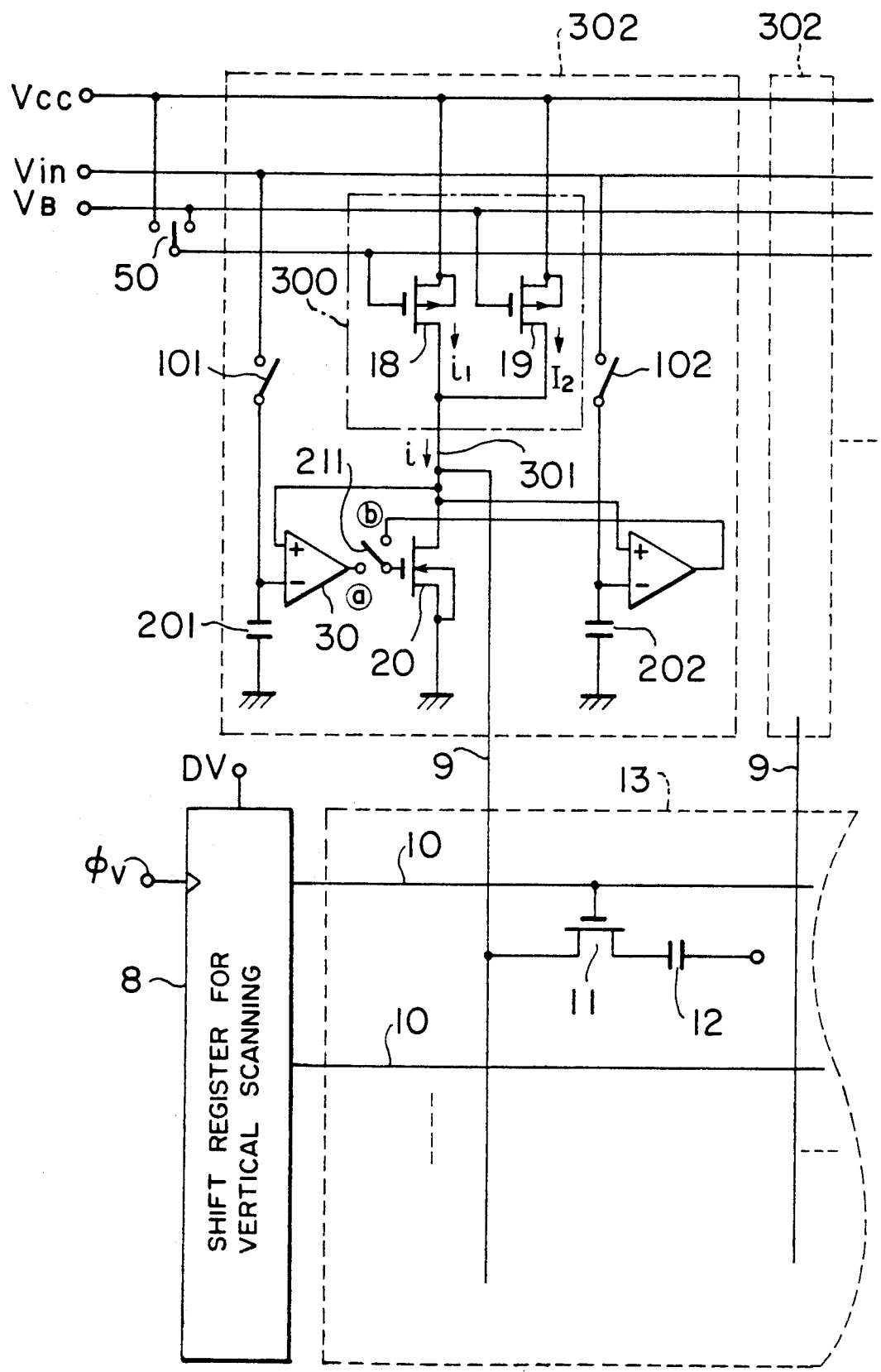
FIG. 9 shows a third embodiment of a capacitive load drive circuit according to the present invention.
Figure 10:
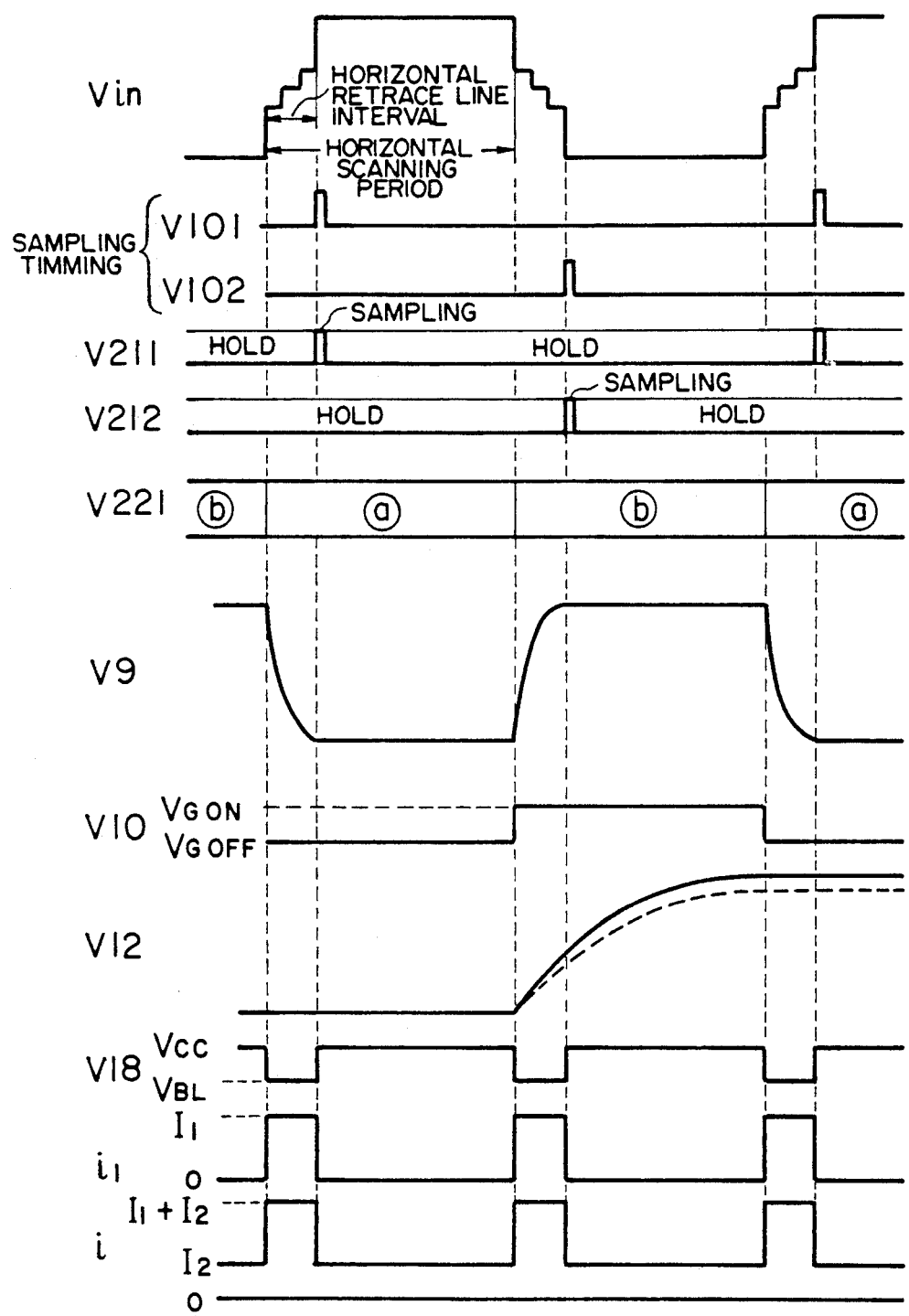
FIG. 10 shows operation waveforms of the embodiment illustrated in FIG. 9.

Another embodiment of the present invention is shown in FIG. 9. The embodiment of FIG. 9 will now be described by operation waveforms exemplified in FIG. 10. The embodiment of FIG. 9 differs from that of FIG. 5 in that a common source circuit having a gain is used as the circuit for driving the column signal electrode 9 instead of the source follower. In FIG. 9, an n-channel MOS transistor used as the common source circuit is supplied with a bias current. A bias current circuit of the present invention comprises p-channel MOS transistors 18 and 19.

In order to shorten the rise time of the voltage of the column signal electrode 9, a large bias current represented as $i = I_1 + I_2$ is supplied to the common source circuit during a horizontal retrace line interval to increase the current which can be outputted and drive the column signal electrode 9. After the output voltage reaches the same value as the voltage value of the hold capacitance 201 (or 202), voltage of the $V_{CC}$ level is applied to the gate of the p-channel MOS transistor (or PMOSFET) 18 by the voltage changeover circuit 50 to change the p-channel MOS transistor 18 into the cutoff state, resulting in the relation $i_1 = 0$. Hence the output common source circuit operates with a small bias current represented as $i = I_2$. Since the common source circuit besides the differential amplifier 30 has a gain in the embodiment of FIG. 9, the overall gain becomes larger than that of the embodiment of FIG. 5. Since the offset voltage is in proportion to the inverse of the gain, reduced offset voltage as compared with the embodiment of FIG. 5 is attained in addition to the reduced power dissipation.

It is evident that similar effects can be obtained even if the p-channel MOS transistors are replaced by n-channel MOS transistors in the embodiments heretofore described. Further, circuits using MOS transistors have been exemplified as the bias current circuit in the foregoing description. Even if MOS transistors are replaced by junction type FETs or bipolar transistors, however, similar effects can be obtained. When the bias current circuit comprises MOS transistors, the channel width and the channel length of each MOS transistor are so designed that the predetermined current value may be obtained. When the bias current circuit comprises bipolar transistors, however, predetermined emitter resistance may be connected to the emitter electrode of each transistor to obtain a predetermined current value.

As heretofore described, the present invention provides changeover between a plurality of current values with little irregularity and large changeover ratios. Further, the channel width, channel length (or emitter size), gate voltage (or base voltage) or the like of each MOS transistor (or bipolar transistor) constituting the bias current circuit can be set to conform to a specific value of current let flow through the MOS transistor (or bipolar transistor). That is to say, desired voltage can be applied to the gate (or base) to let flow a required current. Accordingly, a wide dynamic range is obtained by using a bias current circuit according to the present invention. In addition, the power dissipation can be advantageously reduced as compared with the case where the capacitive load is always driven by a large current.

Figure 11:
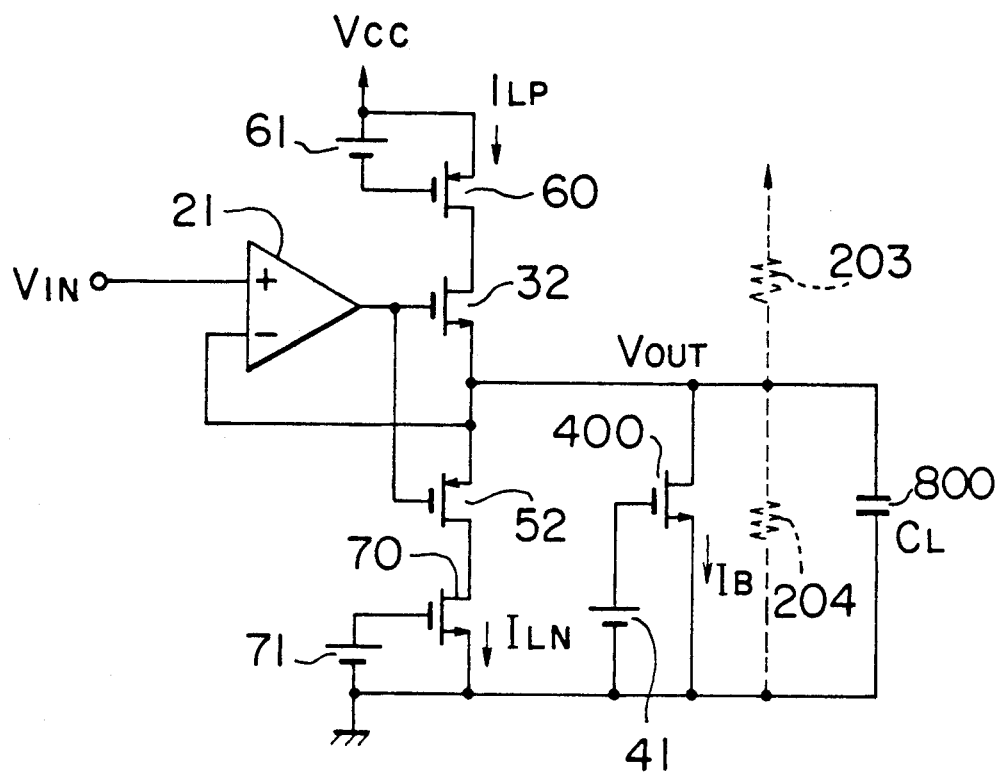
FIG. 11 shows a fourth embodiment of a capacitive load drive circuit according to the present invention.

FIG. 11 is a configuration diagram showing another embodiment of the present invention, which is applied to an output buffer amplifier for a liquid crystal display apparatus comprising CMOSFETs. In FIG. 11, numeral 21 denotes a differential amplifier, 32 an NMOSFET, and 52 a PMOSFET. Numeral 800 denotes load capacitance, i.e., capacitance of a drain bus. Numeral 400 and 41 denote an NMOSFET and a constant voltage source, respectively. The NMOSFET 400 and the constant voltage source 41 constitute a constant current source. Further, an NMOSFET 70 and a constant voltage source 71 constitute a current limit circuit. And a PMOSFET 60 and a constant voltage source 61 constitute a current limit circuit.

In comparing the circuit of the present embodiment with the circuit having the configuration illustrated in FIG. 3, the voltage output circuit 1 of FIG. 3 corresponds to the differential amplifier 21 and the NMOSFET 32 of the present embodiment, and the current source 2 of FIG. 3 corresponds to the NMOSFET 70 and the constant voltage source 71 of the present embodiment. Further, the switch 3 and the control means 40 of FIG. 3 corresponds to the PMOSFET 52 of the present invention, while the current source 5 of FIG. 3 corresponds to the NMOSFET 400 and the constant voltage source 41 of the present embodiment. In one view, the circuit of the present embodiment can be regarded as a circuit obtained by adding a constant current source to a kind of SEPP (single-ended push-pull) circuit comprising the NMOSFET 32 and the PMOSFET 52.

A conventional capacitive load drive circuit comprising a voltage follower, in which a SEPP (single-ended push-pull) circuit is used in the later stage of the differential amplifier to perform power amplification and the output of the SEPP circuit is supplied to the differential amplifier in a negative feedback form, is described in "Linear IC Jitsuyo Kairo Manual (Linear IC Practical Circuits Manual)" written by Yojiro Yokoi and published by Radio Gijutsu Sha, Japan, 1980, p. 105, for example.

The output of the differential amplifier 21 is supplied to the two MOSFETs 32 and 52 constituting the SEPP circuit. The output of the SEPP circuit is entirely fed back negatively to the differential amplifier 21, a voltage follower being formed. Assuming that on-voltage values (gate-source voltage values where the drain current begins to flow) of the NMOSFET 32 and the PMOSFET 52 are $V_{thN}$ (gate voltage with respect to the source) and $T_{thP}$ (source voltage with respect to the gate), respectively, the relation $$V_{thN} + V_{thP} > 0$$

must be satisfied in order to prevent the through current.

If there is no change in the input of this output buffer amplifier, the minute constant current source comprising the NMOSFET 400 and the voltage source 41 extracts charge from the load and lower the potential thereof. After elapse of sufficient time, therefore, the PMOSFET 52 turns off irrespective of the input voltage. Since the NMOSFET 32 and the minute constant current source comprising the NMOSFET 400 and the voltage source 41 function as a source follower circuit, the output error is very small. If the input signal $V_{IN}$ rises from this state, the NMOSFET 32 abruptly injects charge into the load capacitance 800 to attempt to abruptly raise the output. Since the current limit circuit comprising the PMOSFET 60 and the constant voltage source 61 is connected to the drain of the NMOSFET 32, however, the peak current is limited. Especially in case the number of outputs is large and there is a possibility that all outputs change simultaneously such as in case of a liquid crystal driver, it is important to limit the peak current. The rise time $t_r$ of the output buffer amplifier depends upon an amount of voltage change $\Delta V$, the value $C_L$ of the load capacitance 800, and a current $I_{LP}$ of the current limit circuit comprising the PMOSFET 60 and the constant voltage source 61 as $$t_r = \frac{\Delta V \cdot C_L}{I_{LP}}.$$

The falling characteristics will now be described. If the input voltage $V_{IN}$ falls down from the steady state, the NMOSFET 32 first turns off. When a change in the input voltage is large, the PMOSFET 52 succeedingly turns on. Since the current limit circuit comprising the NMOSFET 70 and the constant voltage source 71 is connected to the drain of the PMOSFET 52, the peak current is limited this time as well. The minute constant current source comprising the NMOSFET 400 and the constant voltage source 41 always extracts the charge from the load capacitance 800. When the PMOSFET 52 is on, therefore, both the PMOSFET 52 and the minute constant current source comprising the NMOSFET 400 and the constant voltage source 41 extract the charge from the load capacitance 800.

Figure 12:
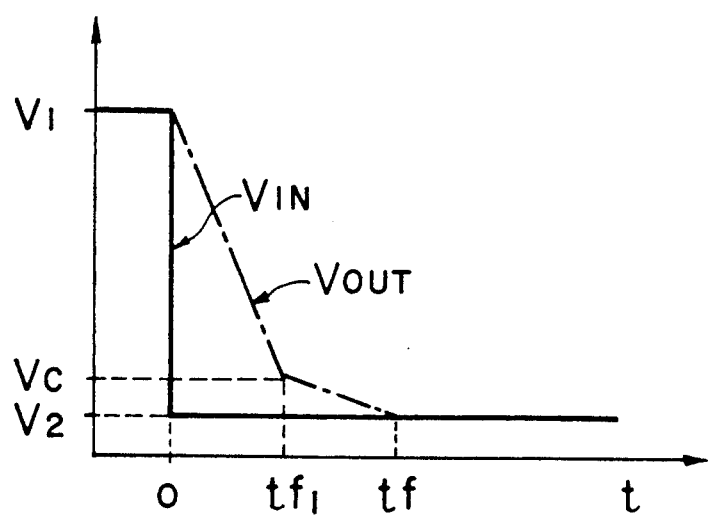
FIG. 12 is a graph showing rising and falling characteristics of the output for explaining the operation of the embodiment illustrated in FIG. 11.

FIG. 12 is a graph showing the falling characteristics of the output of the circuit illustrated in FIG. 11. The response of the output voltage $V_{OUT}$ changing from $V_1$ to $V_2$ obtained when the input voltage $V_{IN}$ changes in a steplike form is shown in FIG. 12.

When time t is in the range from 0 to $t_{f1}$ of FIG. 12, charge extraction is performed with the sum of currents of the above described two current sources. In general, the constant current source comprising the NMOSFET 400 and the constant voltage source 41 is provided to let flow a minute current $I_B$ for compensating the leak current of the load caused by leak resistance 203 and 204 shown in FIG. 11. It can be said that the fall time $t_{f1}$ nearly depends upon a current $I_{LN}$ of the constant current source comprising the NMOSFET 70 and the constant voltage source 71. Assuming that the gain of the differential amplifier 21 is A, $t_{f1}$ is represented as $$t_{f1} = \frac{V_1 - V_C}{I_B + I_{LN}} \cdot C_L$$

where $$V_C = \frac{V_{thN} + V_{thP}}{1 + A} + V_2.$$

Assuming that the lowest output voltage of the differential amplifier 21 is $V_{doff}$ and the lowest output voltage of the voltage follower is $V_{min}$, however, the relation $$V_{thP} + V_{doff} < V_{min}$$

must be satisfied.

When the output voltage $V_{OUT}$ falls as far as $V_C$, the PMOSFET 52 turns off. For some time after the PMOSFET 52 turns off, the NMOSFET 32 is also in the cutoff state, the charge is slowly extracted from the load capacitance 800 by only the current source comprising the NMOSFET 400 and the constant voltage source 41. This state is continued until the load voltage becomes equal to the input. When the load voltage becomes equal to the input, the NMOSFET 32 turns on to cause the steady state. Since the current $I_B$ of the current source comprising the NMOSFET 400 and the constant voltage source 41 is small, it is necessary to make $V_C$ approach $V_2$ as near as possible. If $V_C$ is too close to $V_2$, however, a through current flows because of irregularity of the process.

The total fall time $t_f$ taken until settling into the steady state is represented as $$t_f = \left\{ \frac{V_1 - V_2 - \frac{V_{thN} + V_{thP}}{1 + A}}{I_B + I_{LN}} + \frac{V_{thN} + V_{thP}}{I_B(1 + A)} \right\} C_L.$$

The dissipated power will now be described. The current which does not directly contribute to the load drive is only the output leak compensation current $I_B$ in the rising operation. Since $I_B$ can be made very small, the overall dissipated power can be limited to the minimum of requirement. Since only the MOSFET 32 is in the on-state and serves as a source follower in the steady state, the dynamic range of the differential amplifier 21 is needed only for an amount required for the output. It is thus possible to reduce the dissipated power by lowering the power supply voltage.

Since the NMOSFET 32 and the PMOSFET 52 do not simultaneously turn on, there is no through current. It is thus possible to drive the load capacitance 800 rapidly while restraining the peak current by connecting a current limit circuit to each drain.

Figure 13:
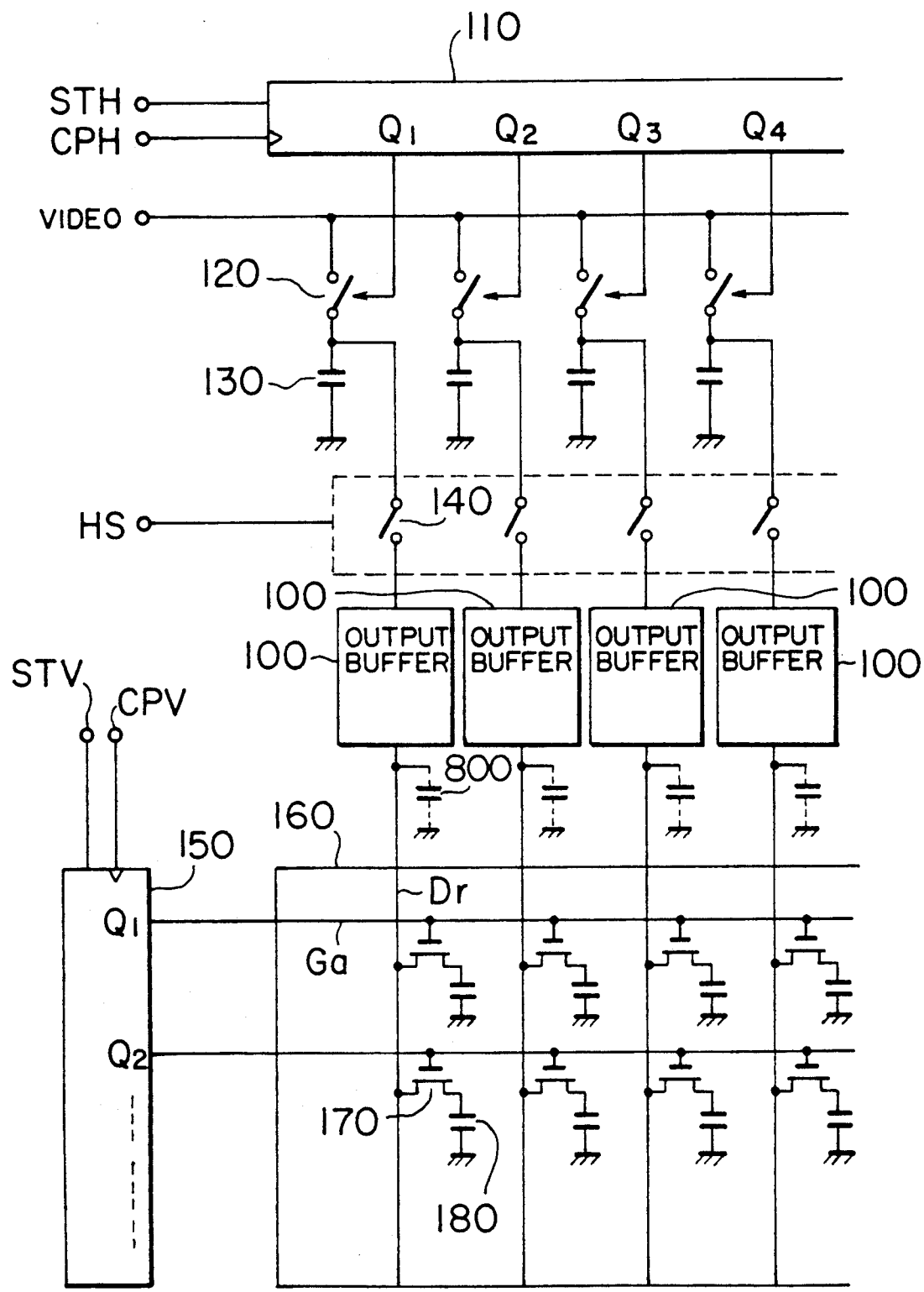
FIG. 13 is a configuration diagram of a liquid crystal display apparatus whereto a capacitive load drive circuit according to the present invention is applied.

FIG. 13 is a configuration diagram showing the entire configuration of an embodiment according to the present invention applied to a liquid crystal display apparatus. A portion 100 corresponds to the output buffer amplifier of FIG. 11. Numeral 110 denotes a shift register for horizontal scanning, and STH and CPH denotes a start pulse and a shift clock, respectively. Numerals 120 and 130 denote an analog switch and hold capacitance, respectively. The analog switch 120 and the hold capacitance 130 constitute a sample-and-hold circuit. The video signal is successively sampled and held by the sample-and-hold circuits in accordance with the outputs of the horizontal scanning shift register. Numeral 140 denotes an analog switch. After the sample-and-hold operation during one horizontal scanning interval is finished, the analog switches 140 are closed to transmit the signal to the output buffer amplifiers 100. Accordingly, the input of the output buffer amplifier 100 is a DC signal changing in a steplike form. The output of the output buffer amplifier 100 is connected to a drain bus Dr of a TFT liquid crystal panel 160 to charge and discharge capacitance 800 thereof. The drain bus Dr is connected to the drain of a TFT 170 provided for each pixel. When voltage is supplied via a gate bus Ga by a shift register 150 for vertical scanning, potential on the drain bus is applied to each liquid crystal cell 180. In this way, the TFT liquid crystal panel 160 is driven.

In FIG. 13, CPV and STV denote a shift clock and a start pulse of the vertical scanning shift register, respectively. And HS denotes a control signal of the analog switch 140.

Figure 14:
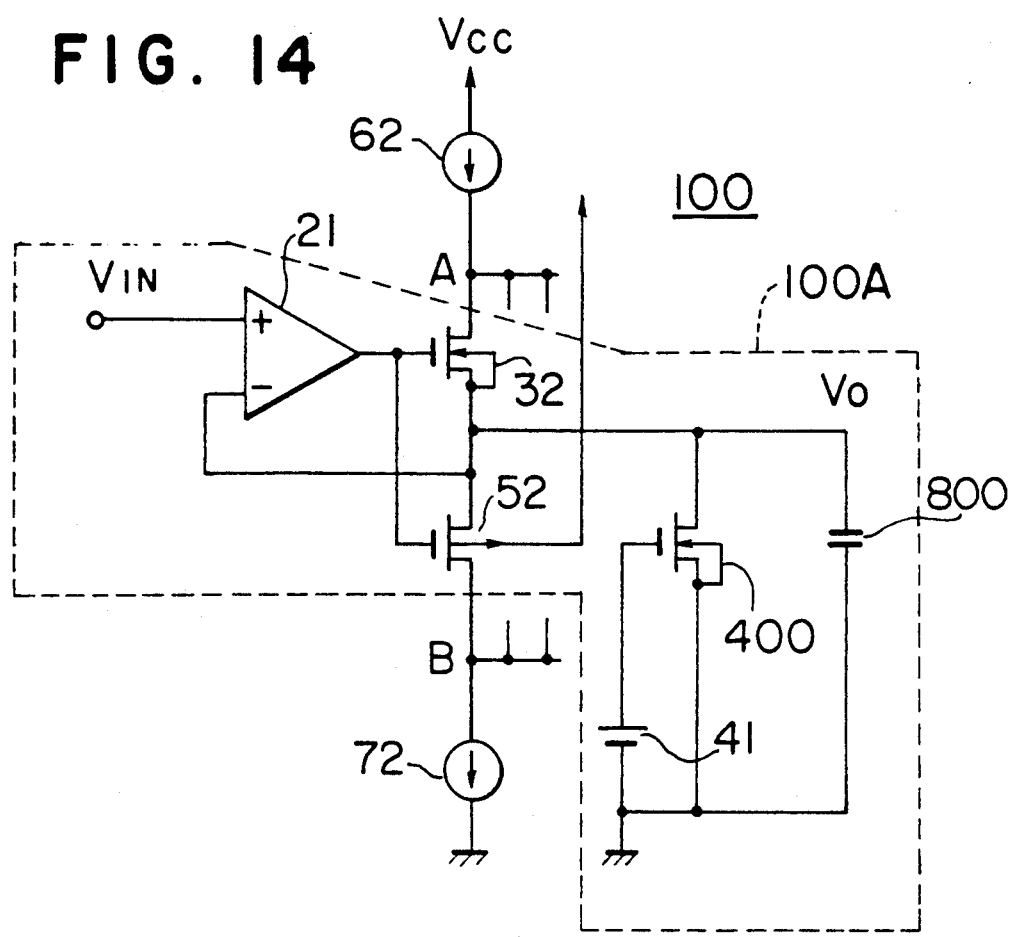
FIG. 14 shows a fifth embodiment of a capacitive load drive circuit according to the present invention.

FIG. 14 is a configuration diagram showing another embodiment of the present invention. The rough configuration of the embodiment shown in FIG. 14 is similar to that of the embodiment shown in FIG. 11. However, the embodiment of FIG. 14 differs from that of FIG. 11 in that a current limit circuit connected to the drain of the NMOSFET 32 and the drain of the PMOSFET 52 is shared by some circuits.

In the above described liquid crystal display apparatus as shown in FIG. 13, the horizontal scanning circuit has as many outputs as horizontal display pixels, and one output buffer amplifier is needed for each output. The current largely changes in an output buffer amplifier, and especially in the amplifier of the last stage. In FIG. 14, therefore, the main power supply of the last stage amplifier is separated from others, and main power supply lines of last stages for a plurality of outputs are connected together to separate power supply through a current limit circuit. Numerals 62 and 72 denote current sources for current limiting which current sources form part of the output buffer 100 for FIG 13 together with the elements identified in the dash-line area 100A. This form is effective especially in integrated circuits. By separating power supply from that of other circuits, interfence is prevented, and the rise time and the fall time of the output as well as the peak current can be easily controlled from the outside.

Figure 15A:
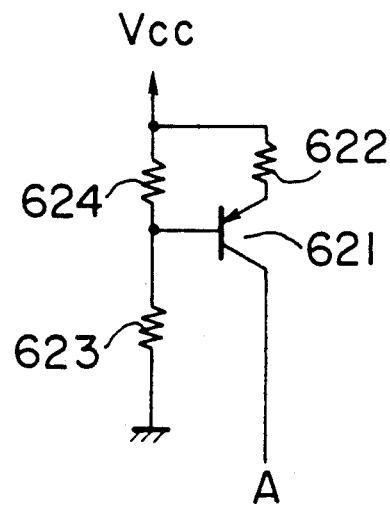
FIGS. 15A and 15B show the configuration of a current limit circuit included in the embodiment of FIG. 14.
Figure 15B:
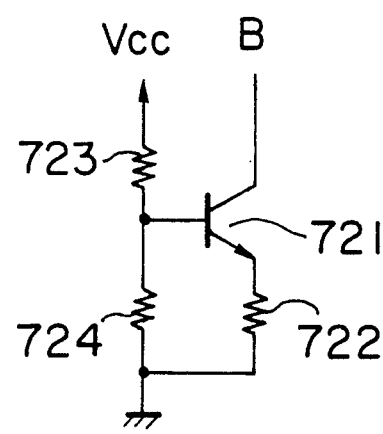

FIGS. 15A and 15B are circuit diagrams for illustrating concrete examples of the current limit circuit shown in FIG. 14 comprising bipolar transistors and resistors. FIG. 15A corresponds to the current limit circuit 62 of FIG. 14, while FIG. 15B corresponds to the current limit circuit 72 of FIG. 14. In FIGS. 15A and 15B, numerals 621 and 721 denote transistors, and numerals 622 to 624 and 722 to 724 denote resistors. Since the operation of the circuits of FIGS. 15A and 15B is self-evident, its description will be omitted. Further, instead of the circuit using a transistor as described above, connection to power supply simply via resistors is also possible.

Figure 16:
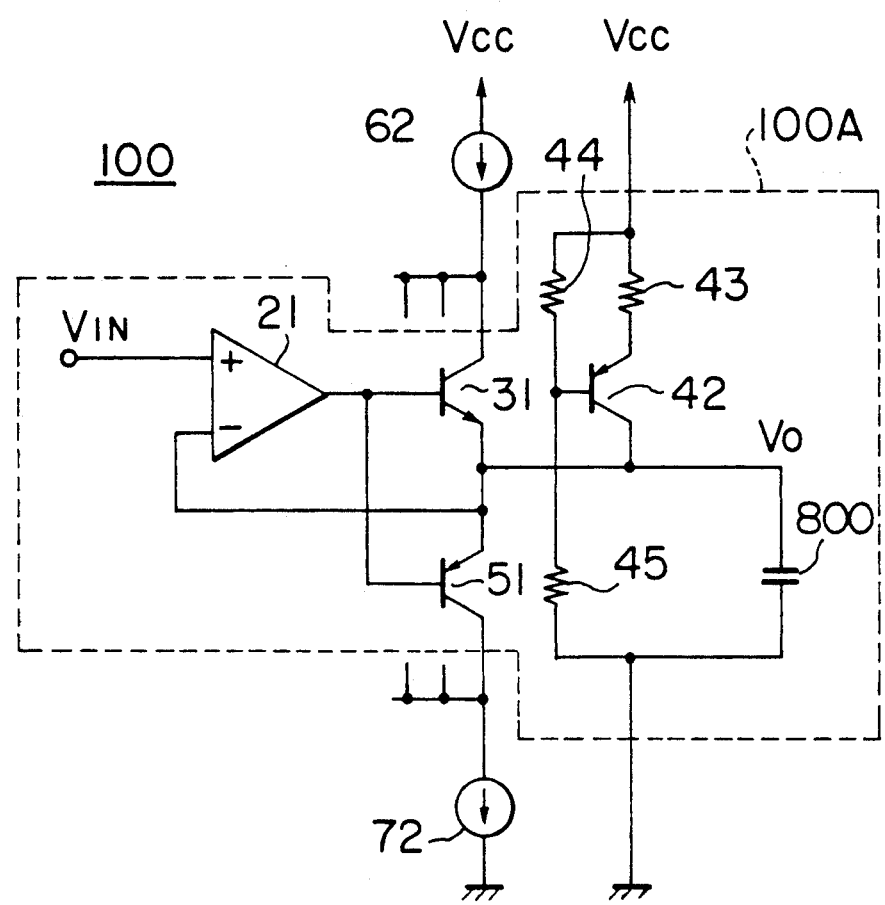
FIG. 16 shows a sixth embodiment of a capacitive load drive circuit according to the present invention.

FIG. 16 is a configuration diagram showing another embodiment of the present invention. The rough configuration of the embodiment of FIG. 16 is similar to that of the embodiment shown in FIG. 14. However, the embodiment of FIG. 16 differs from that of FIG. 14 in that bipolar transistors are used instead of MOSFETs and the current source inserted in parallel to the load capacitance 800 is not that of current extraction type but that of current injection type. Depending upon characteristics of the load, this configuration provides better characteristics. Since the operation is not so different from the operation of the embodiment shown in FIG. 14, only the outline of the operation will now be described.

An NPN transistor 31 and a PNP transistor 51 constitute a SEPP circuit with their bases directly connected. The output of the differential amplifier 21 is supplied to the SEPP circuit. The output of this SEPP circuit is entirely fed back to the differential amplifier 21 negatively, a voltage follower being formed. At the room temperature, $V_{BE}$ (on-voltage between base and emitter) of a bipolar transistor is approximately 0.7 V in case of a silicon transistor, for example. Since the NPN transistor 31 and the PNP transistor 51 are not simultaneously in the on-state, there is no fear that a through current flows. When the input voltage $V_{IN}$ of this voltage follower of negative feedback type changes, the output of the differential amplifier 21 changes with a magnitude enlarged by its gain. And either one of the two transistors 31 and 51 constituting the SEPP circuit turns on to start charging or discharging the load capacitance 800. When the potential of the load capacitance approaches the input potential $V_{IN}$ as a result of charging and discharging and the difference between the input potential (base potential) of the SEPP circuit and the output potential (emitter potential) becomes smaller than $\pm V_{BE}$, however, both the transistor 31 and the transistor 51 turn off to keep the load capacitance from further being charged or discharged by the SEPP circuit. Even if the input potential $V_{IN}$ is identical, the output voltage of the load capacitance 800 varies depending upon the relative magnitude relationship of the potential applied immediately before, i.e., whether it is a rising change or a falling change. If the input potential $V_{IN}$ assumes a present value as a result of a rising change, mainly the NPN transistor 31 in the SEPP circuit performs charging of the load capacitance 800 and the negative feedback. The SEPP circuit turns off when the input voltage of the SEPP circuit is higher than the output voltage thereof by an amount corresponding to $V_{BE}$. Conversely, if the input potential $V_{IN}$ assumes a present value in a falling change, mainly the PNP transistor in the SEPP circuit performs discharging of the load capacitance 800 and the negative feedback. The SEPP circuit turns off when the input voltage of the SEPP circuit is lower than the output voltage by an amount corresponding to $V_{BE}$. In reality, the differential amplifier 21 has a gain. Assuming that the gain is A and that the output when two inputs are equal to each other is $V_{OFST}$, the output voltage of the SEPP circuit becomes $AV_{IN}+V_{OFST}-V_{BE}/1+A$ in a rising change and $AV_{IN}+V_{OFST}+V_{BE}/1+A$ in a falling change. This means that there are two output states for an identical input signal and is not desirable. Therefore, a current source of current injection type comprising a PNP transistor 42 and resistors 43, 44 and 45 is connected to the load to inject a small amount of current. Even after the charging or discharging by the SEPP circuit has been finished, this current source continues to inject charge into the load capacitance 800. Finally, a small amount of current is always let flow mainly by the PNP transistor 51. The load can thus be always driven with output potential (load potential) of $AV_{IN}+V_{OFST}+V_{BE}/1+A$. Since the bias current is always let flow by the current source comprising the PNP transistor 42, the leak of the load capacitance can also be compensated.

Embodiments of the present invention have heretofore been described. In the circuit configuration shown in FIG. 11 or 14 as well, it is possible to insert a constant current source between the output terminal and the positive power supply and use the PMOSFET 52 as a source follower.

Further, the capacitive load drive circuits of the present invention have heretofore been described as output buffer amplifiers for liquid crystal display apparatus. However, the present invention is not limited to this application. It is evident that the present invention can be applied to various DC buffer amplifiers having capacitive loads as well.

As heretofore described, the present invention makes it possible to restrain currents required for other purposes than the load drive and limit the dynamic range of the differential amplifier to a minimum, resulting in an effect of reducing power dissipation. Since the peak current in an output change is limited and charge current or discharge current is averaged, the rising and falling characteristics of CR type bring about linear rising and falling characteristics. It is thus possible to simultaneously satisfy requirements of rapid output change and prevention of interference of peak currents into other circuits. As a result, a capacitive load drive circuit free from the above described drawbacks of the prior art and having excellent function can be provided.

We claim:

1. A capacitive load drive circuit using a voltage follower in which an SEPP (single-ended push-pull) circuit is connected to an output of a differential amplifier and an output of said SEPP circuit is fed back to an inverting input of said differential amplifier, wherein a non-inverting input of the differential amplifier receives an input signal for the capacitive load drive circuit, wherein the sum of on-voltage values of two bipolar transistors (or two FETs) included in said SEPP circuit is larger than zero, bases (or gates) of said two bipolar transistors (or two FETs) being directly connected together, and wherein said capacitive load drive circuit comprises a current limit circuit provided between the collector of at least one of said two bipolar transistors (or the drain of at least one of said two FETs) and a positive or negative power supply, and wherein a constant current source is provided between an output terminal of said SEPP circuit and the positive or negative power supply.

2. A capacitive load drive circuit for driving a capacitive load, comprising:
   (a) a differential amplifier comprising a positive input terminal, to which an input signal voltage is inputted, and an inverse input terminal, wherein an output signal voltage of the differential amplifier increases as a voltage applied to said positive input terminal increases, and the output signal voltage decreases as a voltage applied to said inverse input terminal increases;
   (b) a source follower circuit including an FET (field effect transistor) having a gate terminal to which said output signal voltage of said differential amplifier is inputted, wherein a drain terminal of said FET is connected to a voltage source, and wherein a source terminal of said FET is connected to said capacitive load to be driven, to said inverse input terminal of said differential amplifier, and to a first current source for letting a bias current flow into said FET at a stationary state, said first current source being connected to said capacitive load, wherein the capacitive load is charged through the operation of the differential amplifier and the source follower circuit;
   (c) a second current source for promoting discharge of said capacitive load, said second current source being selectively connected in parallel to said first current source by a switch;
   (d) control means for controlling an ON/OFF state of said switch to selectively connect said capacitive load to said second current source.

3. A capacitive load drive circuit according to claim 2, wherein said control means is coupled to receive a signal, which is independent of said input signal voltage, for controlling said switch, and wherein an output signal voltage of said source follower circuit changes in accordance with said input signal voltage.

4. A capacitive load drive circuit according to claim 2, wherein said control means controls said switch on the basis of a difference in magnitude between the input signal voltage of said differential amplifier and an output signal voltage of said source follower circuit, wherein said output signal voltage changes in accordance with said input signal voltage.

5. A capacitive load drive circuit for driving a capacitive load, comprising:
  (a) a differential amplifier comprising first and second FETs (field effect transistors), source terminals of which are connected with each other and connected to a first current source for letting a bias current flow into said FETs at a stationary state, wherein a drain terminal of said first FET is connected to a voltage source, a drain terminal of said second FET is connected to said voltage source via a load, an input signal voltage is inputted to a gate terminal of said first FET, and the drain terminal and a gate terminal of said second FET are connected with each other and connected to the capacitive load to be driven, wherein the capacitive load is charged through the operation of the differential amplifier;
  (b) a second current source for promoting discharge of said capacitive load, said second current source being selectively connected to source terminals of said first and second FETs in parallel to said first current source by a switch;
  (c) control means for controlling an ON/OFF state of said switch which selectively connects said second current source to source terminals of said first and second FETs.

6. A capacitive load drive circuit according to claim 5, wherein said first FET is directly connected to said voltage source.

7. A capacitive load drive circuit according to claim 5, wherein said first FET is connected to said voltage source via a load.

8. A capacitive load drive circuit comprising a plurality of output buffer units and a current limit circuit, wherein each of said plurality of output buffer units comprises a voltage follower in which an SEPP (single-ended push-pull) circuit which includes two bipolar transistors (or two FETs) is connected to an output of a differential amplifier and an output of said SEPP circuit is fed back to an inverting input of said differential amplifier, wherein a non-inverting input of said differential amplifier receives an input signal for said capacitive load drive circuit, wherein the sum of on-voltage values of two bipolar transistors (or two FETs) included in said SEPP circuit is larger than zero, wherein bases (or gates) of said bipolar transistors (or said FETs) are directly connected together, wherein a constant current source is provided between an output terminal of said SEPP circuit and a positive or negative power supply, and wherein said current limit circuit is provided between respective collectors of at least one of said two bipolar transistors (or respective drains of at least one of said two FETs) and the positive or negative power supply, and wherein said current limit circuit is shared by a plurality of output buffer units.

* * * * *